(12) United States Patent
Lo et al.

(10) Patent No.: US 10,890,548 B2
(45) Date of Patent: Jan. 12, 2021

(54) RESISTIVE GAS SENSOR AND GAS SENSING METHOD THEREFOR

(71) Applicant: Industrial Technology Research Institute, Hsinchu (TW)

(72) Inventors: Ying-Che Lo, Tainan (TW); Yu-Sheng Lin, Tainan (TW); Ting-Hao Hsiao, Chiayi County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 376 days.

(21) Appl. No.: 15/856,012

(22) Filed: Dec. 27, 2017

(65) Prior Publication Data
US 2019/0154604 A1 May 23, 2019

(30) Foreign Application Priority Data

Nov. 23, 2017 (TW) .............................. 106140709 A

(51) Int. Cl.
*G01N 27/04* (2006.01)
*G01N 27/12* (2006.01)
(Continued)

(52) U.S. Cl.
CPC ......... *G01N 27/045* (2013.01); *G01N 27/122* (2013.01); *H03K 3/037* (2013.01); *H03K 23/001* (2013.01)

(58) Field of Classification Search
CPC ........ G05B 1/00; G05B 2219/00; G06K 1/00; G06K 2207/00; G06Q 10/00; G06Q 2220/00; H04Q 1/00; H04Q 2201/00
See application file for complete search history.

(56) References Cited

U.S. PATENT DOCUMENTS

| 5,099,113 A | 3/1992 | Oi et al. |
| 5,457,428 A | 10/1995 | Alder et al. |

(Continued)

FOREIGN PATENT DOCUMENTS

| CN | 1093635 C | 10/2002 |
| CN | 201477059 U | 5/2010 |

(Continued)

OTHER PUBLICATIONS

M. Grassi, et al., "A 141-dB dynamic range CMOS gas-sensor interface circuit without calibration with 16-bit digital output word." IEEE Journal of Solid-State Circuits, Jul. 2007, pp. 1543-1554 vol. 42, No. 7, IEEE, US.

(Continued)

*Primary Examiner* — Jermele M Hollington
*Assistant Examiner* — Temilade S Rhodes-Vivour

(57) ABSTRACT

A resistive gas sensor is provided. The resistive gas sensor includes a sensing circuit and a determination circuit. The sensing circuit senses a gas to generate a detection signal. The determination circuit performs a frequency-division operation on the detection signal by a frequency-division parameter to generate a frequency-division signal, counts a half of a period of the frequency-division signal to generate a half-period count value, and determines concentration of the gas according to the half-period count value. The determination circuit determines the frequency-division parameter according to the half-period count value.

14 Claims, 4 Drawing Sheets

(51) Int. Cl.
*H03K 23/00* (2006.01)
*H03K 3/037* (2006.01)

(56) References Cited

U.S. PATENT DOCUMENTS

| | | | | |
|---|---|---|---|---|
| 6,161,420 | A * | 12/2000 | Dilger | G01R 23/10 |
| | | | | 73/23.21 |
| 6,397,659 | B1 * | 6/2002 | Mizoguchi | G01N 27/407 |
| | | | | 73/23.2 |
| 6,489,787 | B1 | 12/2002 | McFadden | |
| 6,859,737 | B2 | 2/2005 | Kimoto et al. | |
| 8,293,179 | B2 | 10/2012 | Kira | |
| 9,182,366 | B2 | 11/2015 | Izawa et al. | |
| 2010/0164562 | A1 * | 7/2010 | Tseng | G06F 1/08 |
| | | | | 327/118 |
| 2011/0169578 | A1 * | 7/2011 | Lucas | H03L 7/1976 |
| | | | | 331/25 |
| 2013/0333774 | A1 | 12/2013 | Downie et al. | |
| 2014/0000342 | A1 | 1/2014 | Downie | |
| 2015/0101395 | A1 * | 4/2015 | Dehe | G01N 29/2425 |
| | | | | 73/24.02 |
| 2015/0168958 | A1 | 6/2015 | Downie et al. | |
| 2015/0263806 | A1 * | 9/2015 | Puscasu | F41H 1/00 |
| | | | | 398/130 |

FOREIGN PATENT DOCUMENTS

| | | |
|---|---|---|
| CN | 102725630 A | 10/2012 |
| CN | 102879648 B | 10/2015 |
| TW | I325051 | 5/2010 |
| TW | I373615 | 10/2012 |
| TW | I425810 B | 2/2014 |
| TW | I436056 | 5/2014 |
| TW | I454676 | 10/2014 |
| TW | I463137 | 12/2014 |
| TW | 201543803 A | 11/2015 |
| TW | 201709669 A | 3/2017 |
| TW | I582328 | 5/2017 |
| TW | I582329 | 5/2017 |

OTHER PUBLICATIONS

Leung et al., "Integrated interface circuits for chemiresistor arrays," 2005 IEEE International Symposium on Circuits and Systems, May 2005, pp. 5914-5917, IEEE, US.

Guo et al., "A differential readout circuit for tin oxide gas sensor array," 2005 IEEE Conference on Electron Devices and Solid-State Circuitspp, Dec. 2005, 635-638, IEEE, US.

Grassi et al., "A high-precision widerange front-end for resistive gas sensors arrays," Sensors and Actuators B: Chemical, Nov. 2005, pp. 281-285, vol. 111-112, Elsevier, US.

Merino et al., "A reusable smart interface for gas sensor resistance measurement," IEEE Transactions on Instrumentation and Measurement, Aug. 2004, pp. 1173-1178, vol. 53, No. 4, IEEE, US.

Afridi et al., "A monolithic implementation of interface circuitry for CMOS compatible gas-sensor system," International Symposium on Circuits and Systems, ISCAS 2002, May 2002, pp. II-732-II-735, vol. 2, IEEE, US.

D. Barrettino et al., "A smart single-chip micro-hotplate-based chemical sensor system in CMOS-technology," 2002 IEEE International Symposium on Circuits and Systems. Proceedings (Cat. No. 02CH37353), May 2002, pp. II-157-II-160, IEEE, US.

Dickson et al., "Integrated chemical sensors based on carbon black and polymer films using a standard CMOS process and post-processing," 2000 IEEE International Symposium on Circuits and Systems, May 2000, pp. IV-341-IV-344, IEEE, Switzerland.

Afridi et al., "A monolithic CMOS microhotplate-based gas sensor system," IEEE Sensor Journal, Dec. 2002, pp. 644-655, vol. 2, No. 6, IEEE, US.

Taiwan Patent Office, Notice of Allowance, U.S. Appl. No. 106140709, dated Nov. 27, 2018, Taiwan.

* cited by examiner

RESISTIVE GAS SENSOR AND GAS SENSING METHOD THEREFOR

CROSS REFERENCE TO RELATED APPLICATIONS

This Application claims priority of Taiwan Patent Application No. 106140709, filed on Nov. 23, 2017, the entirety of which is incorporated by reference herein.

BACKGROUND OF THE INVENTION

Field of the Invention

The invention relates to a method for sensing the concentration of gas, and more particularly to a resistive gas sensor.

Description of the Related Art

With the development of portable electronic devices, and in order to meet the needs of users, gas sensors have been integrated into portable electronic devices, allowing users to carry and use them more easily. The gas sensors mostly utilize a resistance divider to obtain a sensing voltage. According to this sensing voltage, a change value in the resistance of the sensing element can be detected and then determine the gas concentration. However, the linearity of the sensing voltage is limited by the resistance divider, which restricts to the measurable resistance range of the sensing element. In addition, the sensing voltage is gradually compressed when the voltage level closes to the rail voltage (VDD or GND). It causes that the sensing resolutions of the gas sensor do not keep at a similar level. Moreover, the sensing voltage is an analog type. An extra analog-digital converter is often configured to convert the sensing voltage into a digital signal for a microprocessor to do signal processing. This increases the manufacturing cost of the gas sensor.

BRIEF SUMMARY OF THE INVENTION

The present disclosure provides a resistive gas sensor having a wide measurable resistance range for a sensing element, providing similar sensing resolutions for sensing different gas concentrations, and directly generating a digital signal representing the gas concentration.

One exemplary embodiment of a resistive gas sensor is provided. The resistive gas sensor comprises a sensing circuit and a determination circuit. The sensing circuit senses a gas to generate a detection signal. The determination circuit performs a frequency-division operation on the detection signal with a frequency-division parameter to generate a frequency-division signal, counts a half of a period of the frequency-division signal to generate a half-period count value, and determines the concentration of the gas according to the half-period count value. The determination circuit determines the frequency-division parameter according to the half-period count value.

An exemplary embodiment of a gas sensing method for a resistive gas sensor is provided. The gas sensing method comprises the following steps: sensing a gas through the resistive gas sensor to generate a detection signal; performing a frequency-division operation on the detection signal with a frequency-division parameter to generate a first frequency-division signal; counting a half of a period of the first frequency-division signal to generate a first count value; determining whether the first count value is less than a lower threshold value; when it is determined that the first count value is less than the lower threshold value, increasing the frequency-division parameter; performing the frequency-division operation on the detection signal with the increased frequency-division parameter to generate a second frequency-division signal; counting a half of a period of the second frequency-division signal to generate a second count value; and determining the concentration of the gas according to the second count value.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
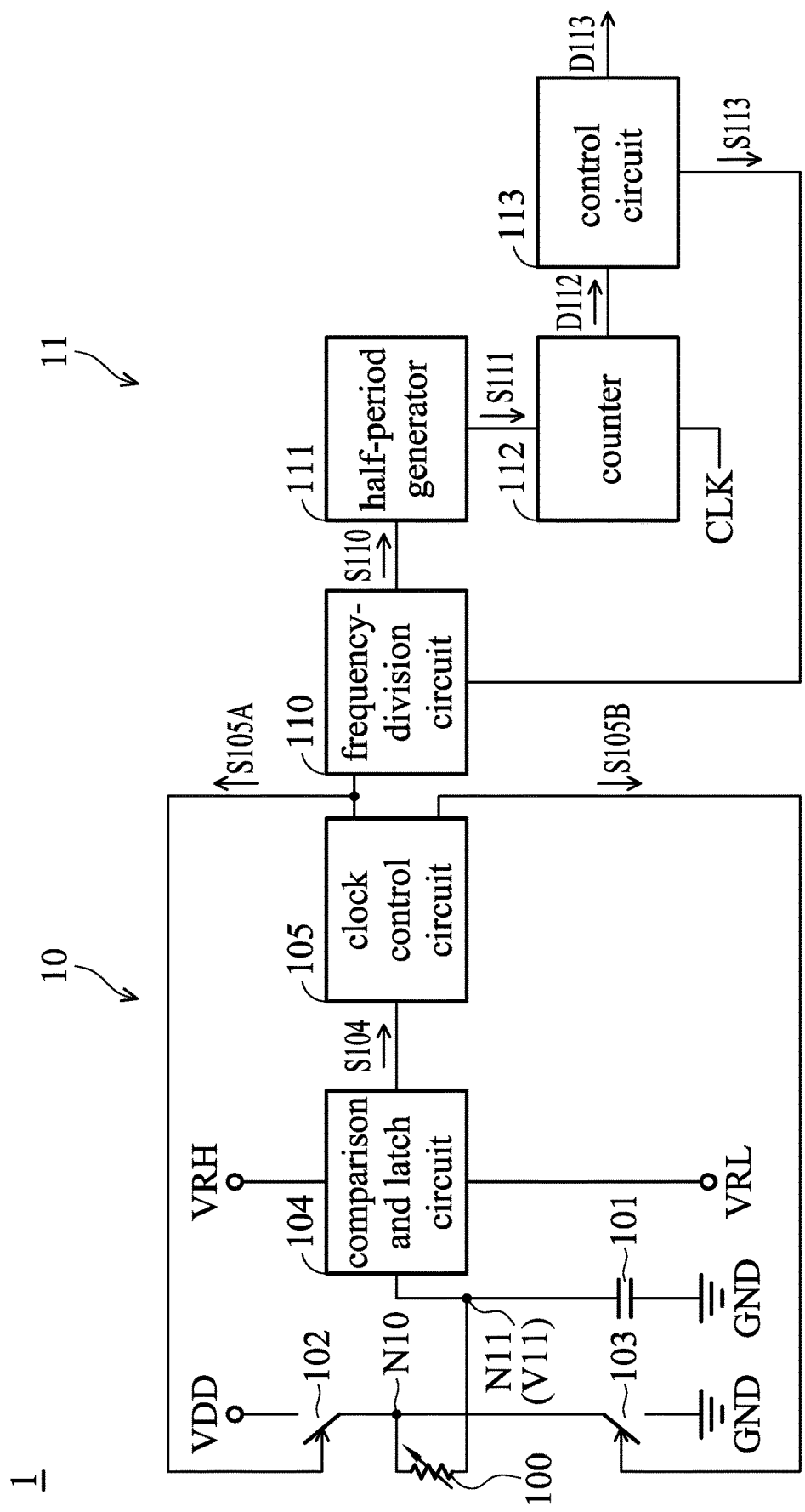
FIG. 1 shows one exemplary embodiment of a resistive gas sensor.

FIG. 1 shows an exemplary embodiment of a resistive gas sensor. Referring to FIG. 1, the resistive gas sensor 1 comprises a sensing circuit 10 and a determination circuit 11, which operate collectively to sense a gas around the resistive gas sensor 1 and determine the concentration the gas. The resistive gas sensor and the gas sensing method according to the embodiments of the present disclosure will be described below with reference to FIG. 1 to FIG. 3. As shown in FIG. 1, the sensing circuit 10 comprises a sensing element 100, a capacitor 101, switches 102 and 103, a comparison and latch circuit 104, and a clock control circuit 105. The determination circuit 11 comprises a frequency-division circuit 110, a half-period generator 111, a counter 112, and a control circuit 113. In the embodiment, the sensing element 100 is implemented as a resistor whose resistance value varies with the concentration of the sensed gas. The sensing element 100 is coupled between nodes N10 and N11, and the capacitor 101 is coupled between the node N11 and the ground GND. Therefore, the sensing element 100 and the capacitor 101 form an RC oscillation circuit.

Figure 2:
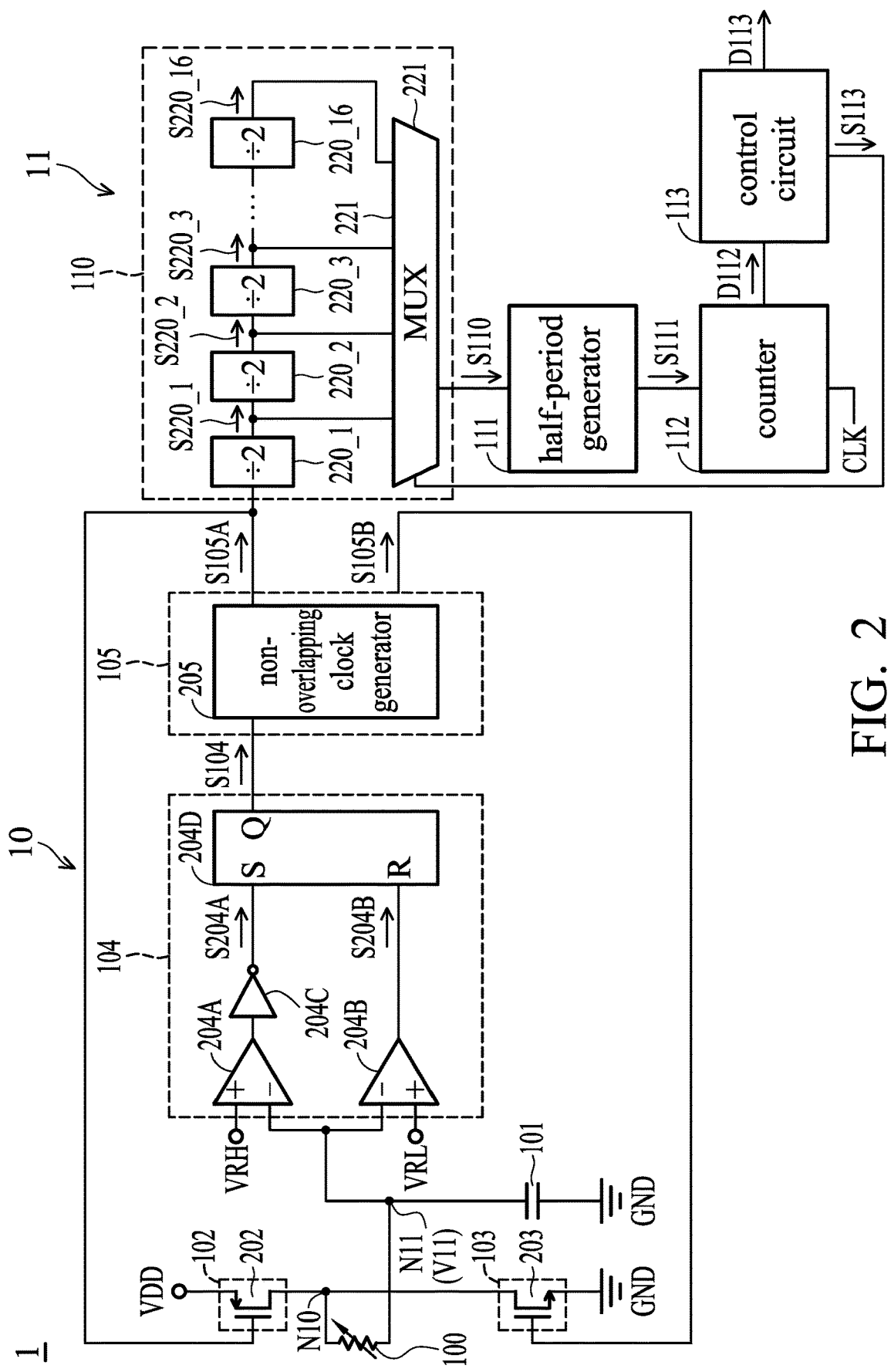
FIG. 2 shows another exemplary embodiment of a resistive gas sensor.
Figure 3:
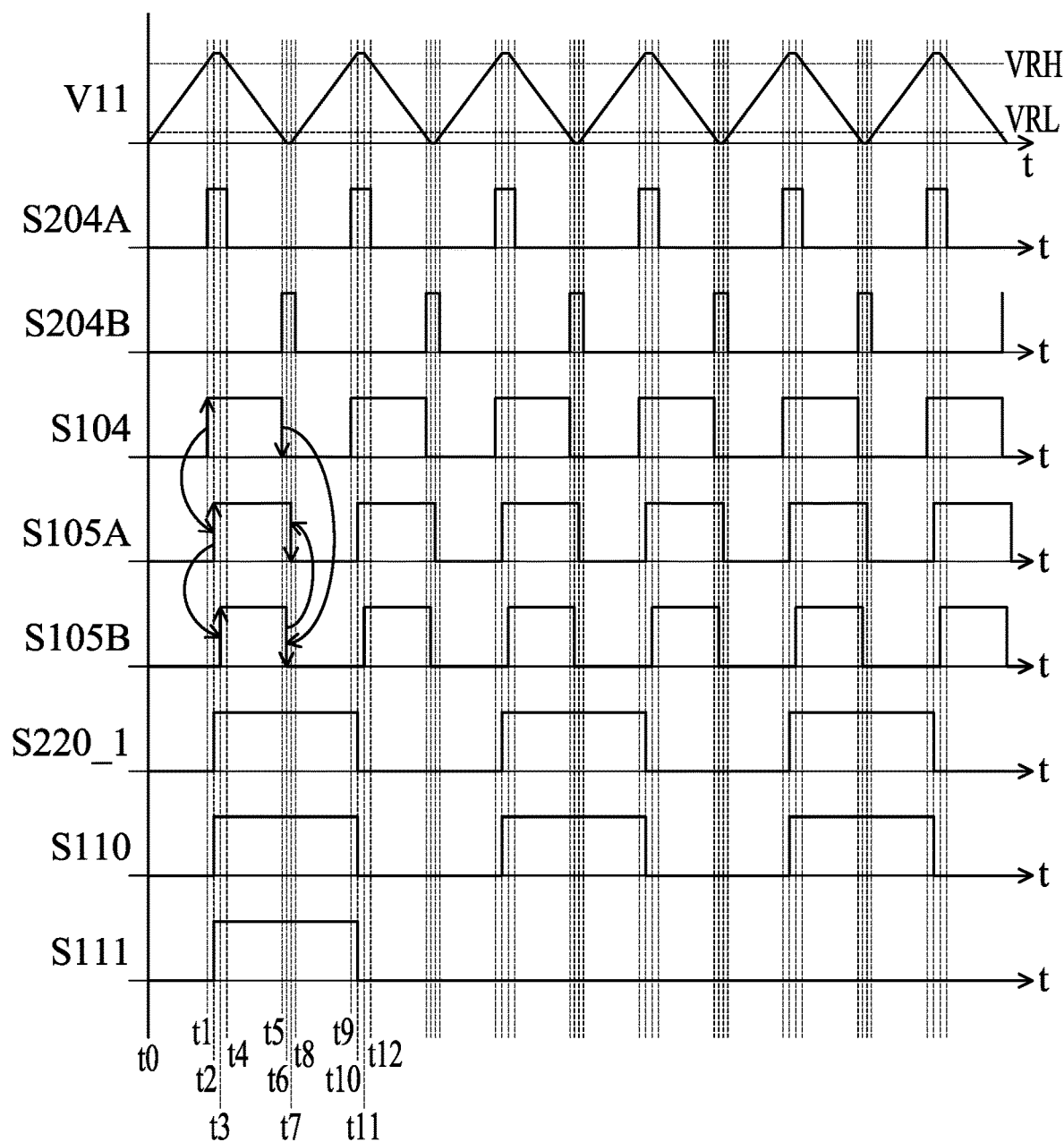
FIG. 3 shows timing chart of main signals of the resistive gas sensor of FIG. 2.

One terminal of the switch 102 is coupled to a voltage source VDD, and the other terminal thereof is coupled to the node N10. One terminal of the switch 103 is coupled to the node N10, and the other terminal thereof is coupled to the ground GND. The on/off states of the switches 102 and 103 are controlled by the control signals S105A and S105B, respectively. In the embodiment, the control signals S105A and S105B are generated by the clock control circuit 105. Referring to FIG. 2, the switches 102 and 103 may be implemented as transistors. In detail, the switch 102 is implemented by a P-type transistor 202, and the switch 103 is implemented by an N-type transistor 203. The gate of the P-type transistor 202 receives the control signal S105A, the source thereof is coupled to the voltage source VDD, and the drain thereof is coupled to the node N10. The gate of the N-type transistor 203 receives the control signal S105B, the drain thereof is coupled to the node N10, and the source thereof is coupled to the ground GND. The P-type transistor 202 and the N-type transistor 203 are respectively controlled by the control signals S105A and S105B to be turned on at different times. That is, the on-duration of the P-type transistor 202 and the on-duration of the N-type transistor 203 do not overlap. In this way, through charging the capacitor 101 by the voltage source VDD via the turned-on P-type transistor 202 and discharging the capacitor 101 to the ground GND via the turned-on N-type transistor 203, the sensing voltage V11 generated at the node N11 changes with the charging and discharging of the capacitor 101 (the change of the sensing voltage V11 is shown in FIG. 3, and a detailed change will be described later). Since the charging/discharging time of the capacitor 101 is affected by the resistance value of the sensing element 100, the signal or parameter derived from the charging/discharging time of the capacitor 101 is correlated with the concentration of the sensed gas.

Referring again to FIG. 1, the comparison and latch circuit 104 is coupled the node N11 to receive the sensing voltage V11. The comparison and latch circuit 104 compares the sensing voltage V11 with an upper threshold voltage $V_{RH}$ and a lower threshold voltage $V_{RL}$ and generates an enable signal S104 according to the comparison result. Referring to FIG. 2, in an embodiment, the comparison and latch circuit 104 comprises comparators 204A and 204B, an inverter 204C, and an SR flip-flop 204D. The positive input terminal (+) of the comparator 204A receives the upper limit voltage $V_{RH}$, and the negative input terminal (−) thereof receives the sensing voltage V11. The inverter 204C is coupled to the output terminal of the comparator 204A. The comparator 204A generates a corresponding output signal at its output terminal according to the comparison result, and the output signal is inverted by the inverter 204C. The inverted output signal from the inverter 204C serves as the comparison signal S204A (referred to as a first comparison signal). The positive input terminal (+) of the comparator 204B receives the lower threshold voltage $V_{RL}$, and the negative input terminal (−) receives the sensing voltage V11. The comparator 204B generates a comparison signal S204B (referred to as a second comparison signal) at its output terminal according to the comparison result. The set terminal (S) of the SR flip-flop 204D receives the comparison signal S204A, the reset terminal (R) receives the comparison signal S204B, and the output terminal (Q) generates the enable signal S104. According to the operation of the SR flip-flop, each time the signal at the set terminal (S) or the reset terminal (R) is switched from a low voltage level to a high voltage level (that is, each time a rising edge of the comparison signal S204A or S204B occurs), the enable signal S104 at the output terminal (Q) is switched to another voltage level (that is, a rising or falling edge of the enable signal S104 occurs), for example, the enable signal S104 is switched to a high voltage level from a low voltage level (rising edge) or to a low voltage level from a high voltage level (falling edge).

As shown in FIG. 1, the clock control circuit 105 receives the enable signal S104 and generates the control signals S105A and S105B according to the enable signal S104. As described above, in order to make the sense voltage V11 changing with the charging/discharging of the capacitor 101 to further obtain signals or parameters correlated with the concentration of the sensed gas, the P-type transistor 202 and the N-type transistor 203 cannot be turned on simultaneously. Therefore, the duration in which the control signal S105A is at a low voltage level to turn on the P-type transistor does not overlap the duration in which the control signal S150B is at a high voltage level to turn on the N-type transistor, as shown in FIG. 3. Referring to FIG. 2, the clock control circuit 105 comprises a non-overlapping clock generator 205. The non-overlapping clock generator 205 receives the enable signal S104 and generates the control signals S105A and S105B according to the enable signal S104. As described above, the comparison and latch circuit 104 generates the comparison signals 5204A and 5204B by comparing the sensing voltage V11 with the upper limit voltage $V_{RH}$ and the lower limit voltage $V_{RL}$. Therefore, the time period between the time point when a rising edge of the comparison signal S204A occurs and the time point of a rising edge of the comparison signal S204B occurs represents the charging/discharging time of the sensing voltage V11. As such, the period of the enable signal S104 may indicate the charging/discharging time of the sensing voltage V11, that is, the period of the enable signal S104 is correlated with the concentration of the sensed gas.

In the embodiment, the non-overlapping clock generator 205 uses a pulse of the enable signal S104 (for example, a portion at the high voltage level) as a basis for the occurrence of the pulses of the control signals S105A and S105B. Referring to FIG. 3, after the enable signal S104 is switched to the high voltage level from the low voltage level (rising edge) at the time point t1, the control signal S150A is switched to the high voltage level from the low voltage level at the time point t2, and then the control signal S150B is switched to the high voltage level from the low voltage level at the time point t3. After the enable signal S104 is switched to the low voltage level from the high voltage level (falling edge) at the time point t5, the control signal S150B is switched to the voltage level from the high voltage level at the time point t6, and then the control signal S150A is switched to the low voltage level from the high voltage level at the time point t7. In other words, after a rising edge of the enable signal S104 occurs, the rising edge of the control signal S105A and the rising edge of the control signal S105B occur sequentially; after the falling edge of the enable signal S104 occurs, the falling edge of the control signal S105B and the falling edge of the control signal S105A occur sequentially. As a result, the duration (for example, from the time point t7 to the time point t10) in which the control signal S105A is at the low voltage level (for example, the period from the time point t7 to t10) does not overlap the duration (for example, the time point t3 to the time point t6) in which the control signal S150B is in the high voltage level. As described above, since the non-overlapping clock generator 205 generates the control signals S105A and S105B according to the enable signal S104, the periods of the control signals S105A and S105B may indicate the charging/discharging time of the sensing voltage V11, that is, both the periods of the control signals S105A and S105B are correlated with the concentration of the sensed gas.

Referring to FIG. 1, in the embodiment, since the period of the control signal S105A is correlated with the concentration of the sensed gas, the control signal S105A serves as a detection signal which is obtained when the sensing circuit 10 senses the gas. The frequency-division circuit 110 in the determination circuit 11 receives the control signal S105A (that is, the detection signal) and performs a frequency-division operation on the control signal S105A with a frequency-division parameter to generate a frequency-division signal S110. The frequency-division parameter is determined or controlled by a frequency-division control signal S113 generated by the control circuit 113. Referring to FIG. 2, the frequency-division circuit 110 comprises a plurality of frequency dividers 220 which are connected in series and further comprises a multiplexer (MUX) 221. In the embodiment, sixteen divide-by-2 frequency dividers 220_1~220_16 are taken as an example for description. The frequency dividers 220_1~220_16 divide the frequencies of their received input signals by a value of 2 (referred to as a frequency-division sub-parameter) to generate respective output signals S220_1~S220_16, respectively. The first one among the frequency dividers 220_1~220_16 receives the control signal S105A as its input signal (referred to as the corresponding input signal of the frequency divider 220_1), and each of the other frequency dividers 220_2~220_16 receives the output signal of the previous frequency divider as its input signal (referred to as the corresponding input signal of each of the other frequency dividers 220_2~220_16). The output signals S220_1~S220_16 are transmitted to the input terminal of the multiplexer 221. The multiplexer 221 is controlled by the frequency-division control signal S113 generated by the control circuit 113 and selects one of the output signals S220_1~S220_16 as the frequency-division signal S110. According to the above description, the adjustment of the frequency-division parameter by the control circuit 113 can be achieved through controlling the multiplexer 221 by the frequency-division control signal S113. In the embodiment, the frequency-division parameter is equal to the product of the frequency-division sub-parameters of the frequency dividers 220_2~220_16 (the frequency-division sub-parameter of each frequency divider is equal to 2) corresponding to the selected output signal. For example, when the multiplexer selects the output signal S220_1 as the frequency-division signal S110 according to the frequency-division control signal S113, the frequency-division parameter is 2, that is, the control signal S105A is divided by 2; when the multiplexer selects the output signal S220_3 as the frequency-division signal S110 according to the frequency-division control signal S113, the frequency-division parameter is 8 ($2^3$), that is, the control signal S105A is divided by 8. According to the above description, the period of the control signal S105A is correlated with the concentration of the sensed gas. Thus, even if the period of the frequency-division signal S110 which is obtained by performing the frequency division on the control signal S105A becomes larger, the period of the frequency-division signal S110 is still correlated with the concentration of the sensed gas.

After obtaining the frequency-division signal S110, the half-period generator 111 generates a half-period signal S111 according to the frequency-division signal S110. The pulse duration of the half-period signal S111 is equal to a half of the period of the frequency-division signal S110 and is correlated with the concentration of the sensed gas. Next, the counter 112 receives the half-period signal S111. The counter 112 counts the pulse duration of the half-period signal S111 based on the clock signal CLK to generate a half-period count value D112. In the embodiment, the half-period count value D112 is a 16-bit value, the target precision of the half-period count value D112 is 13 bits. The half-period count value D112 is transmitted to the control circuit 113. The control circuit 113 generates the frequency-division control signal S113 according to the half-period count value D112 to determine or control the frequency-division parameter for the frequency-division circuit 110.

Figure 4:
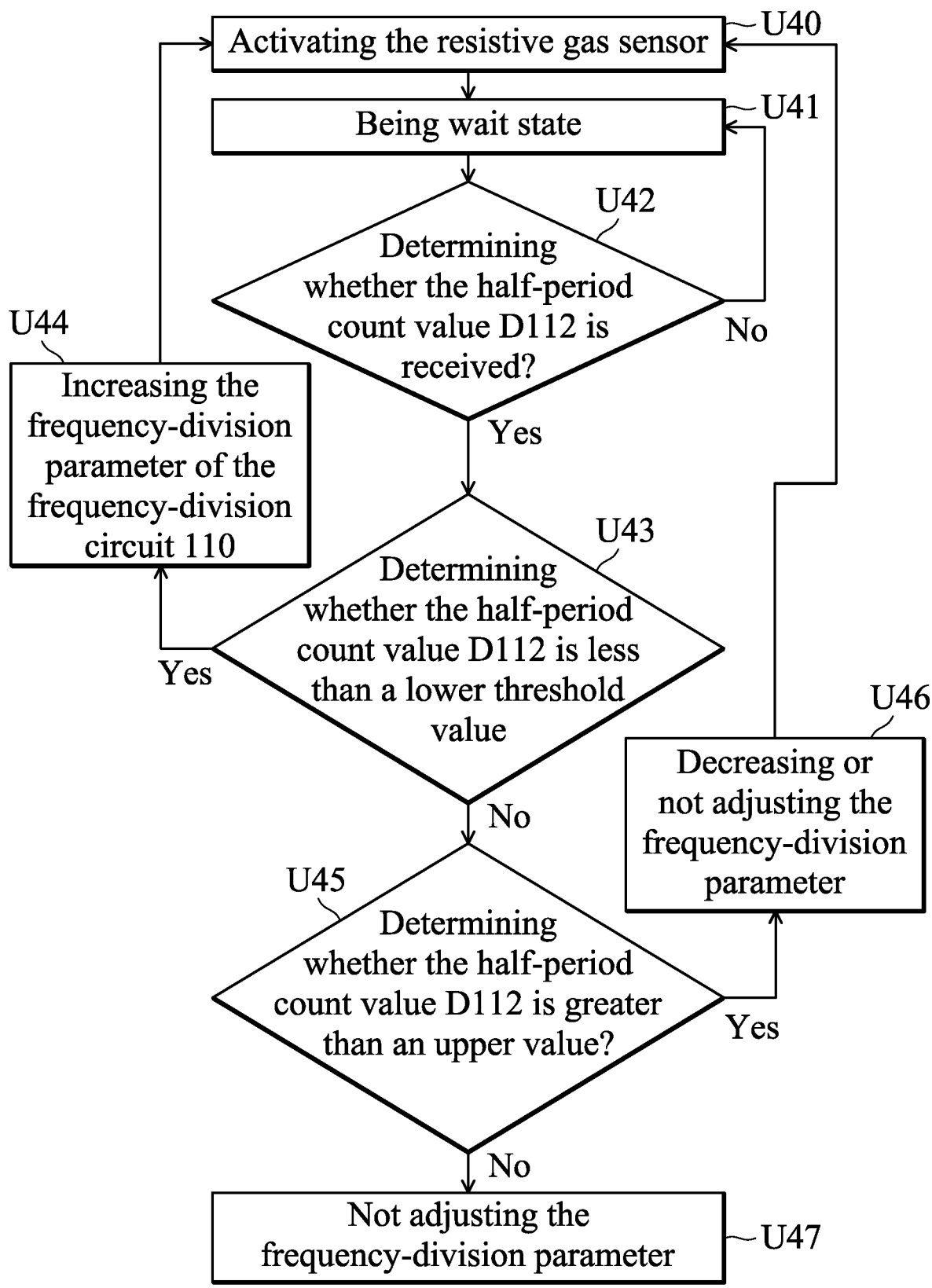
FIG. 4 is a flow chart for controlling a frequency-division parameter according to an exemplary embodiment of a gas sensing method.

FIG. 4 is a flow chart for controlling the frequency-division parameter according to an exemplary embodiment of the gas sensing method. Referring to FIG. 4, when the resistive gas sensor 1 is activated (step U40), the control circuit 113 is in a wait state (step U41) and determines whether the half-period count value D112 is received (step U42). When the control circuit 113 does not receive the half-period count value D112 (step U42-NO), the control circuit 113 continues to be in the wait state until the half-period count value D112 is received. When the control circuit 113 receives the half-period count value D112 (step U42-YES), the control circuit determines whether the half-period count value D112 is less than a lower threshold value (step U43). When the control circuit 113 determines that the half-period count value D112 is less than the lower threshold value (step U43-Y), the control circuit 113 increases the frequency-division parameter of the frequency-division circuit 110 through the frequency-division control signal S113 (step U44). After the frequency-division parameter is increased, the half-period count value D112 is increased due to the lengthening of the pulse duration of the half-period signal S111. When the control circuit 113 determines that the half-period count value D112 is not less than the lower value (in step U43-No), the control circuit 113 determines whether the half-period count value D112 is greater than an upper value (step U45). When the control circuit 113 determines that the half-period count value D112 is greater than the upper threshold value (step U45-Y), the control circuit 113 decreases the frequency-division parameter of the frequency-division circuit 110 through the frequency-division control signal S113 or does not adjust the frequency-division parameter (step U46). In cases where the frequency-division parameter is decreased, the half-period count value D112 is decreased due to the shortening of the pulse duration of the half-cycle signal S111. When the control circuit 113 determines that the half-period count value D112 is not greater than the upper threshold value (step U45-No), the control circuit 113 does not adjust the frequency-division parameter (step U47). The half-period count value D112 corresponding to a different concentration can have a similar resolution by adjusting the frequency-division parameter.

According to the embodiment, the control circuit 113 further determines the concentration of the sensed gas according to the half-period count value D112 and generates a corresponding concentration value D113. As described above, the pulse duration of the half-period signal S111 is correlated with the concentration of the sensed gas. Therefore, the half-period count value D112 obtained by counting the pulse duration is also correlated with the concentration of the sensed gas, so that the control circuit 113 can determine the concentration of the sensed gas according to the half-period count value D112.

As described above, depending on the operation of the control circuit 113, the frequency-division parameter may be maintained or adjusted (increased or decreased). Therefore, in the embodiment, the frequency-division parameter is used by the control circuit 113 as a basis for determining the concentration of the sensed gas, and the frequency-division parameter may be varied according to the determination results of the steps U43 and U45. When the control circuit 113 does not adjust the frequency-division parameter according to the determination result of the step U45, the control circuit 113 determines the concentration of the sensed gas based on the current half-period count value D112. For example, it is assumed that the 16-bit half-period count value D112 is 6280 ("0001 1000 1000 1000"). When the control circuit 113 does not adjust the frequency-division parameter according to the determination result of the step U45, the control circuit 113 determines that a gain is $2^0$ (=1) (that is, the degree of the adjustment of the frequency-division parameter is one time) and generates the frequency-division control signal S113 according to the gain to control the multiplexer 221 not to change the selected output signal. Therefore, the half-period count value D112 is maintained on 6280, and 6280 serves as a detection count value. In other words, the multiplexer 221 continuously selects the current output signal as the frequency-division signal S110. At this time, the control circuit 113 determines the current resistance value (for example, 16 MΩ) of the sensing element 100 according to the detection count value (=6280), and determines the concentration of the sensed gas according to the determined resistance value.

When the control circuit 113 adjusts (increases or decreases) the frequency-division parameter of the frequency-division circuit 110 according to the determination result of the step U43 or U45, the control circuit 113 further determines the concentration of the sensed gas according to the half-period count value D112 which is obtained after the adjustment. For example, it is assumed that the 16-bit half-period count value D112 is 196 ("0000 0000 1100 0100"). When the control circuit 113 adjusts the frequency-division parameter and determines that the gain is $2^5$ (=32) according to the based on the determination result of the step U43 (that is, the degree of the adjustment of the frequency-division parameter is 32 times), the control circuit 113 generates the frequency-division control signal S113 according to the gain to control the multiplexer 221 to select another output signal (for example, the selected output signal becomes the output signal S220_6 from the output signal S220_1), thereby increasing the frequency-division parameter. At this time, the half-period count value D112 becomes 6272 ("0001 1000 000 0000"), and the resolution of the half-period count value D112 increases by 32 times. After receiving the increased half-period count value D112, the control circuit 113 divides the half-period count value D112 (that is 6272) by 32 (corresponding to the degree of the adjustment of the frequency-division parameter), and the result of the division is taken as the detection count value for determine the current resistance value (for example, 512 kΩ) of the sensing element 100. The concentration of the sensed gas is determined according to the determined resistance value. In the embodiment, the control circuit 113 may store the half-period count value D112 ("0001 1000 000 0000") in a built-in register. The integer bits of half-period count values D112 (that is, the first eleven five bits of "0001 1000 000 0000") are stored in an integer portion of the register, and the decimal bits of the half-period count value D112 (that is, the last 5 bits in "0001 1000 000 0000") are stored in the decimal portion of the register. In an embodiment, the register stores a lookup table, which contains different resistance values and the corresponding concentration values. After the control circuit 113 receives the increased half-period count value D112 and determines the current resistance value of the sensing element 100, the control circuit 13 may checks the lookup table to obtain the corresponding concentration value as the concentration of the sensed gas.

According to the above embodiment, when the resistance value of the sensing element 100 is 16 MΩ, the half-period count values D112 which is obtained after the adjustment of the frequency-division parameter through the frequency-division circuit 110 and control circuit 113 is 6208; when the resistance value of the sensing element 100 is 512 kΩ, the half-period count values D112 which is obtained after the adjustment of the frequency-division parameter through the frequency-division circuit 110 and control circuit 113 is 6272. Thus, it is obvious that the similar sensing resolutions are obtained for the sensed gases with different concentrations.

In the following, the operation of the resistive gas sensor 1 will be described in detail through FIGS. 2 and 3.

Referring to FIG. 3, at the time point t0, the P-type transistor 202 is turned on according to the control signal S105A with the low voltage level, and the N-type transistor 203 is turned off according to the control signal S105B of the low voltage level, so that the sensing voltage V11 gradually rises as the capacitor 101 is charged by the voltage source VDD. In the embodiment, since the sensing element 100 and the capacitor 101 form an RC oscillation circuit, the charging/discharging time of the capacitor 101 is affected by the resistance value of the sensing element 100, that is, the slop by which the sensing voltage V11 gradually rises is correlated with the resistance value of the sensing element 100. Once the sensing voltage V11 exceeds the upper threshold voltage $V_{RH}$ (for example, at time t1), the comparison signal S204A switched to the high voltage level through the operations of the comparator 204A and the inverter 204C. At this time, the enable signal S104 generated by the SR flip-flop 204D is switched to the high voltage level in response to the rising edge of the comparison signal S204A. The non-overlapping clock generator 205 switches the control signal S105A to the high voltage level from the low voltage level at the time point t2 delayed from the time point t1 in response to the rising edge of the enable signal S104 and switches the control signal S105B to the high voltage level from the low voltage level at the time point t3 delayed from the time point t2. In this way, the P-type transistor 202 is turned off according to the control signal S150A with the high voltage level at the time point t2, so that the sensing voltage V11 stops rising at the time point t2 and remains at a voltage level until the time point t3. At time t3, the N-type transistor 203 is turned on according to the control signal S150B with the high voltage level, so that the capacitor 101 starts being discharge, and the sensing voltage V11 starts dropping.

At the time point t4, the sensing voltage V11 is lower than the upper threshold voltage $V_{RH}$. Through the operations of the comparator 204A and the inverter 204C, the comparison signal S204A is switched to the low voltage level. The sensing voltage V11 gradually decreases, and the slop by which the sensing voltage V11 gradually decreases is correlated with the resistance value of the sensing element 100. Once the sensing voltage V11 is lower than the lower threshold voltage $V_{RL}$ (for example, at the time point t5), the comparison signal S204B is switched to the high voltage level by the operation of the comparator 204B. At this time, the enable signal S104 generated by the SR flip-flop 204D is switched to the low voltage level in response to the rising edge of the comparison signal S204B. The non-overlapping clock generator 205 switches the control signal S105B to the low voltage level from the high voltage level at the time point t6 delayed from the time point t5 in response to the falling edge of the enable signal S104 and switches the control signal S105A to the low voltage level from the high voltage level at the time point time t7. In this way, the N-type transistor 203 is turned off according to the control signal S150B with the low voltage level at the time point t6, so that the sensing voltage V11 stops falling at the time point t6 and remains at a voltage level until the time point t7. At the time point t7, the P-type transistor 202 is turned on according to the control signal S150A with the low voltage level, so that the capacitor 101 starts being charged, and the sensing voltage V11 starts rising gradually. At the time point t8, the sensing voltage V11 exceeds the lower threshold voltage $V_{RL}$. Through the operation of the comparator 204B, the comparison signal S204B is switched to the low voltage level. After the time point t8, the sensing circuit 10 performs the same operation as described above, and the explanation is omitted here.

The frequency-division circuit 110 divides the control signal S105A (the detection signal). For example, referring to FIG. 2 and FIG. 3, the frequency divider 220_1 divides the control signal S105A by a value of 2 to obtain the output signal S220_1. As such, the period of the output signal S220_1 is twice the period of the control signal S105A. In the embodiment of FIG. 3, it is assumed that the multiplexer 221 selects the output signal S220_1 as the frequency-division signal S110 according to the frequency-division control signal S113. The pulse duration of the half-period signal S111 generated by the half-period generator 111 is equal to a half of the period of the output signal S220_1 and further correlated with the concentration of the sensed gas. The counter 112 counts the pulse duration of the half-period signal S111 according to the clock signal CLK to generate the half-cycle count D112. The control circuit 113 generates the frequency-division control signal S113 according to the half-period count value D112 to determine or control the frequency-division parameter of the frequency-division circuit 110.

As described above, in the embodiment, the control signal S105A is taken as the detection signal transmitted to the frequency-division circuit 110. In other embodiments, the period of the enable signal S104 is also associated with the concentration of the sensed gas, so the enable signal S104 can be taken as the detection signal.

According to the embodiment, the resistive gas sensor 1 detects the change of the resistance value of the sensing element 100 by detecting the oscillation period of the detection signal S105A to obtain the concentration of the sensed gas. Compared with the technique of detecting the change of the resistance value by utilizing the resistance divider, the oscillation period has a better linearity and a wider measurable resistance range for the sensing element 100. Furthermore, since the counter 112 performs the counting operation on the half-period of the signal S111, the counter 112 directly outputs a digital signal, the half-period count value D112. Therefore, the resistive gas sensor 1 does not need to additionally configure an analog-to-digital converter that increases the cost. As disclosed in the above embodiment, through the determination of the gain and the control of the frequency-division parameter by the control circuit 113, the similar resolutions of the half-period counter value D112 can be obtained while sensing different gas concentrations, thereby determining the concentration of the sensed gases more accurately.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistive gas sensor comprising:
   a sensing circuit sensing a gas to generate a detection signal; and
   a determination circuit performing a frequency-division operation on the detection signal with a frequency-division parameter to generate a frequency-division signal, counting a half of a period of the frequency-division signal to generate a half-period count value, and determining concentration of the gas according to the half-period count value,
   wherein the determination circuit determines the frequency-division parameter according to the half-period count value.

2. The resistive gas sensor as claimed in claim 1,
   wherein when the frequency-division parameter is a first parameter, the half-period count value generated by the determination circuit is equal to a first count value, and
   wherein when the determination adjusts the frequency-division parameter according to the first count value, the determination circuit changes the half-period count value in response to the adjusted frequency-division parameter.

3. The resistive gas sensor as claimed in claim 2,
   wherein the determination circuit determines whether the first count value is less than a lower threshold value; and
   wherein when the determination circuit determines that the first count value is less than the lower threshold value, the determination circuit adjusts the frequency-division parameter to be a second parameter which is greater than the first parameter, generates the half-period count value which is equal to a second count value, and determines the concentration of the gas according to the second count value.

4. The resistive gas sensor as claimed in claim 3,
   wherein when the determination circuit determines that the first count value is not less than the lower threshold value, the determination circuit determines whether the first count value is greater than an upper threshold value; and
   wherein when the determination circuit determines that the first count value is greater than the upper threshold value, the determination circuit adjusts the frequency-division parameter to be a third parameter which is less than the first parameter, generates the half-period count value which is equal to a third count value, and determines the concentration of the gas according to the third count value.

5. The resistive gas sensor as claimed in claim 1, wherein the determination circuit comprises:
   a frequency-division circuit receiving the detection signal and performing the frequency-division operation on the detection signal with the frequency-division parameter to generate the frequency-division signal;
   a half-period generator generating a half-period signal according to the frequency-division signal, wherein a pulse duration of the half-period signal is equal to the half of the period of the frequency-division signal;
   a counter receiving the half-period signal and counting the pulse duration of the half-period signal according to a clock signal to generate the half-period count value; and
   a control circuit receiving the half-period count value, and determining a gain according to the half-period count value, and generating a frequency-division control signal for determining the frequency-division parameter, wherein the gain represents a degree of the adjustment of the adjust frequency-division parameter.

6. The resistive gas sensor as claimed in claim 5, wherein the frequency-division circuit comprises:
- a plurality of frequency dividers connected in series, wherein each frequency divider divides a frequency of an input signal of the frequency divider with a frequency-division sub-parameter to generate an output signal, the first one among the plurality of frequency dividers receives the detection signal as the corresponding input signal, and each of the other frequency dividers receives the output signal of the previous frequency divider as the corresponding input signal; and
- a multiplexer coupled to the plurality of frequency dividers to receive the output signals and controlled by the frequency-division control signal to select one of the output signals as the frequency-division signal, and
- wherein the frequency-division parameter is equal to a product of the frequency-division sub-parameters of the frequency dividers corresponding to the selected output signal.

7. The resistive gas sensor as claimed in claim 5, wherein the control circuit divides the half-period count value by the gain to obtain a detection count value and determines the concentration of the gas according to the detection count value.

8. The resistive gas sensor as claimed in claim 1, wherein the sensing circuit comprises:
- a first switch coupled between a voltage source and a first node and controlled by a first control signal;
- a second switch coupled between the first node and a ground and controlled by a second control signal;
- a sensing element coupled between the first node and a second node and having a resistance value, wherein the resistance value varies with the concentration of the gas;
- a capacitor coupled between the second node and the ground, wherein a sensing voltage is generated at the second node;
- a comparison and latch circuit receiving the sensing voltage and comparing the sensing voltage with an upper threshold voltage and a lower threshold voltage to generate a first comparison signal and a second comparison signal, wherein the first comparison signal represents a comparison result between the upper threshold voltage and the sensing voltage, the second comparison signal represents a comparison result between the lower threshold voltage and the sensing voltage, and the comparison and latch circuit comprises:
  - an SR flip-flop having a set terminal receiving the first comparison signal, a reset terminal receiving the second comparison signal, and an output terminal generating an enable signal; and
- a clock control circuit receiving the enable signal and generating the first control signal and the second control signal according to the enable signal,
- wherein a first duration in which the first switch is turned on by the first control signal does not overlap a second duration in which the first switch is turned on by the first control signal does not overlap turned, and
- wherein the first control signal serves as the detection signal.

9. The resistive gas sensor as claimed in claim 8, wherein the sensing element is a resistor.

10. The resistive gas sensor as claimed in claim 8, wherein the clock control circuit comprises:
- a non-overlapping clock generator receiving the enable signal and generating the first control signal and the second control signal according to a plurality of pulses of the enable signal, and
- wherein the first control signal is at a low voltage level in the first duration to turn on the first switch, and the second control signal is at a high voltage level in the second duration to turn on the second switch.

11. A gas sensing method for a resistive gas sensor comprising:
- sensing a gas through the resistive gas sensor to generate a detection signal;
- performing a frequency-division operation on the detection signal with a frequency-division parameter to generate a first frequency-division signal;
- counting a half of a period of the first frequency-division signal to generate a first count value;
- determining whether the first count value is less than a lower threshold value;
- when it is determined that the first count value is less than the lower threshold value, increasing the frequency-division parameter;
- performing the frequency-division operation on the detection signal with the increased frequency-division parameter to generate a second frequency-division signal;
- counting a half of a period of the second frequency-division signal to generate a second count value; and
- determining concentration of the gas according to the second count value.

12. The gas sensing method as claimed in claim 11, further comprising:
- when it is determined that the first count value is not less than the lower threshold value, determining whether the first count value is greater than an upper threshold value;
- when it is determined that the first count value is greater than the upper threshold value, decreasing the frequency-division parameter;
- performing the frequency-division operation on the detection signal with the decreased frequency-division parameter to generate a third frequency-division signal;
- counting a half of a period of the third frequency-division signal to generate a third count value; and
- determining the concentration of the gas according to the third count value.

13. The gas sensing method as claimed in claim 11, wherein the step of determining the concentration of the gas according to the second count value comprises:
- diving the second count value by a value corresponding to a degree of the increase in the frequency-division parameter to obtain a detection count value; and
- determining the concentration of the gas according to the detection count value.

14. The gas sensing method as claimed in claim 11, wherein the gas is sensed by an RC oscillation circuit of the resistive gas sensor.

* * * * *